United States Patent
Igarashi et al.

(10) Patent No.: US 12,094,507 B2
(45) Date of Patent: Sep. 17, 2024

(54) HOLOGRAM RECORDING COMPOSITION, HOLOGRAM RECORDING MEDIUM, DIFFRACTION OPTICAL ELEMENT, AND OPTICAL DEVICE, OPTICAL COMPONENT, AND IMAGE DISPLAY DEVICE USING DIFFRACTION OPTICAL ELEMENT

(71) Applicant: Sony Group Corporation, Tokyo (JP)

(72) Inventors: Eri Igarashi, Tokyo (JP); Takahiro Ohe, Tokyo (JP); Hisaya Hara, Tokyo (JP); Kenshiro Kawasaki, Tokyo (JP); Daisuke Hobara, Tokyo (JP)

(73) Assignee: Sony Group Corporation, Tokyo (JP)

( * ) Notice: Subject to any disclaimer, the term of this patent is extended or adjusted under 35 U.S.C. 154(b) by 540 days.

(21) Appl. No.: 17/312,860

(22) PCT Filed: Oct. 21, 2019

(86) PCT No.: PCT/JP2019/041403
§ 371 (c)(1),
(2) Date: Jun. 10, 2021

(87) PCT Pub. No.: WO2020/121653
PCT Pub. Date: Jun. 18, 2020

(65) Prior Publication Data
US 2022/0013142 A1   Jan. 13, 2022

(30) Foreign Application Priority Data

Dec. 11, 2018  (JP) ................................. 2018-231346

(51) Int. Cl.
*G11B 7/0065* (2006.01)
*C08F 2/50* (2006.01)
(Continued)

(52) U.S. Cl.
CPC .............. *G11B 7/0065* (2013.01); *C08F 2/50* (2013.01); *G02B 5/32* (2013.01); *G03H 1/0248* (2013.01);
(Continued)

(58) Field of Classification Search
None
See application file for complete search history.

(56) References Cited

U.S. PATENT DOCUMENTS 4,835,193 A  *  5/1989  Hayase ................... G03F 7/038
                                                        522/170
4,942,102 A  *  7/1990  Keys ........................ G03H 1/24
                                                         430/1

(Continued)

FOREIGN PATENT DOCUMENTS

CN       101329546 A       12/2008
CN       108780273 A       11/2018
(Continued)

OTHER PUBLICATIONS

International Search Report mailed Jan. 28, 2020 in connection with PCT/JP2019/041403.

*Primary Examiner* — Martin J Angebranndt
(74) *Attorney, Agent, or Firm* — K&L Gates LLP

(57) ABSTRACT

To provide a hologram recording composition that can further improve diffraction characteristics and transparency of a hologram.
The present technology provides a hologram recording composition containing a heteropoly acid, a photopolymerizable monomer, a photopolymerization initiator, and a sensitizing dye having absorption in a visible light region in the presence of an acid. The present technology also provides a hologram recording medium including at least a photocurable resin layer containing a heteropoly acid, a photopolymerizable monomer, a photopolymerization ini-
(Continued)

tiator, and a sensitizing dye having absorption in a visible light region in the presence of an acid. Furthermore, the present technology also provides a diffraction optical element using the hologram recording medium. Moreover, the present technology also provides an optical device, an optical component, and an image display device using the diffraction optical element.

11 Claims, 1 Drawing Sheet

(51) Int. Cl.
    *G02B 5/32*     (2006.01)
    *G03H 1/02*     (2006.01)
    *G11B 7/24044*     (2013.01)
    *G11B 7/245*     (2006.01)
    *G11B 7/246*     (2013.01)

(52) U.S. Cl.
    CPC .......... *G11B 7/24044* (2013.01); *G11B 7/245* (2013.01); *G11B 7/246* (2013.01); *G03H 2001/0264* (2013.01); *G03H 2260/12* (2013.01)

(56) References Cited

U.S. PATENT DOCUMENTS

| | | | | |
|---|---|---|---|---|
| 5,710,255 | A | * 1/1998 | Shepard | C07K 16/18 424/138.1 |
| 2002/0142227 | A1 | 10/2002 | Dhar et al. | |
| 2013/0034805 | A1 | * 2/2013 | Hayashida | G03F 7/027 430/2 |
| 2015/0212487 | A1 | * 7/2015 | Azakami | G03H 1/0272 359/3 |
| 2019/0202946 | A1 | 7/2019 | Hara et al. | |

FOREIGN PATENT DOCUMENTS

| | | | | |
|---|---|---|---|---|
| EP | 2058702 | A1 | | 5/2009 |
| JP | S63254111 | A | | 10/1988 |
| JP | 04051146 | A | * | 2/1992 |
| JP | H04152249 | A | | 5/1992 |
| JP | H11352303 | A | | 12/1999 |
| JP | 2005043507 | A | | 2/2005 |
| JP | 2005062757 | A | | 3/2005 |
| JP | 2005077741 | A | * | 3/2005 |
| JP | 2007248925 | A | | 9/2007 |
| JP | 2008224805 | A | * | 9/2008 ............. C08F 10/00 |
| JP | 2009035650 | A | * | 2/2009 |
| JP | 2009086298 | A | * | 4/2009 |
| JP | 2010133887 | A | | 6/2010 |
| JP | 2014044242 | A | | 3/2014 |
| JP | 2014065853 | A | * | 4/2014 |
| JP | 2014137462 | A | | 7/2014 |
| JP | 2015027803 | A | | 2/2015 |
| JP | 2017014322 | A | * | 1/2017 |
| KR | 20130115116 | A | | 10/2013 |
| KR | 20170111658 | A | * | 10/2017 |
| TW | 201819542 | A | | 6/2018 |
| WO | WO-2017104424 | A1 | | 6/2017 |
| WO | 2018043593 | A1 | | 3/2018 |

\* cited by examiner

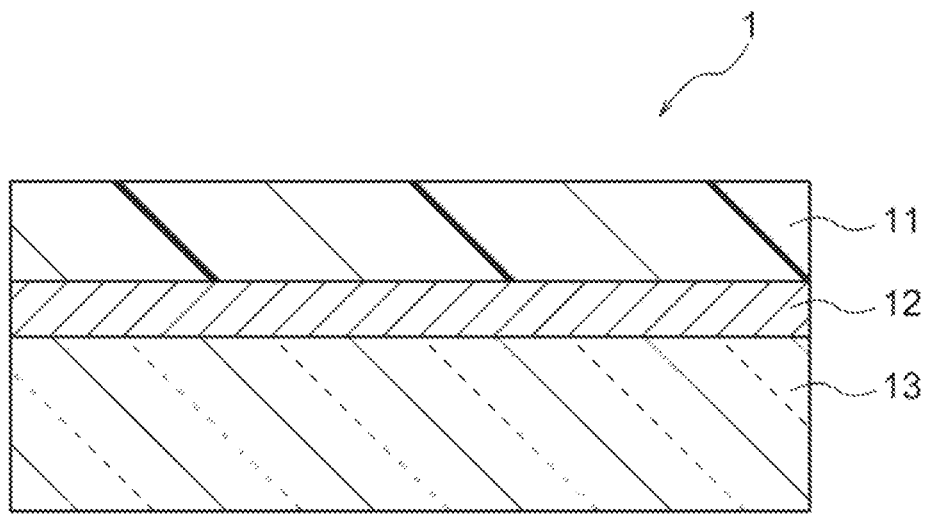

HOLOGRAM RECORDING COMPOSITION, HOLOGRAM RECORDING MEDIUM, DIFFRACTION OPTICAL ELEMENT, AND OPTICAL DEVICE, OPTICAL COMPONENT, AND IMAGE DISPLAY DEVICE USING DIFFRACTION OPTICAL ELEMENT

TECHNICAL FIELD

The present technology relates to a hologram recording composition, a hologram recording medium, a diffraction optical element, and an optical device, an optical component, and an image display device using the diffraction optical element.

BACKGROUND ART

A hologram is obtained by recording a light and dark (interference) pattern of light on a photosensitive material and the like as a pattern of a refractive index and the like, and is widely used in a field such as optical information processing, security, medicine, or a head-up display. The hologram can record three-dimensional information regarding an object as light information in a large capacity, and therefore is attracting attention as a next-generation recording medium.

Various proposals have been made for a material for the hologram so far. For example, Patent Document 1 proposes an optical product including a three-dimensional crosslinked polymer matrix and one or more photoactive monomers, in which at least one of the photoactive monomers has a portion that is substantially absent in the polymer matrix in addition to a monomer functional group, and the matrix polymer and a polymer generated from polymerization of the one or more photoactive monomers are compatible with other.

Furthermore, Patent Document 2 proposes a hologram recording composition that records interference fringes due to interference of coherent light by a difference in refractive index, the hologram recording composition containing a polymerizable thiophene ring compound having: a) a group selected from the group consisting of a thiophene ring group, a condensed thiophene ring group, a group in which a plurality of thiophene rings and/or condensed thiophene rings are linked through a single bond, and a group in which a plurality of thiophene rings and/or condensed thiophene rings are linked through a linking group; and b) a polymerizable functional group.

Moreover, Patent Document 3 proposes a volume type hologram resin composition containing at least one photopolymerizable compound, a photopolymerization initiator, and inorganic metal-based fine particles, in which an average particle diameter of the inorganic metal-based fine particles is smaller than a recording wavelength of a hologram.

CITATION LIST

Patent Document

Patent Document 1: Japanese Patent Application Laid-Open No. 11-352303
Patent Document 2: Japanese Patent Application Laid-Open No. 2005-043507
Patent Document 3: Japanese Patent Application Laid-Open No. 2005-062757

SUMMARY OF THE INVENTION

Problems to be Solved by the Invention

However, in hologram technology, it is required to further improve diffraction characteristics and transparency of a hologram. Therefore, a main object of the present technology is to provide a hologram recording composition that can further improve diffraction characteristics and transparency of a hologram, a hologram recording medium, a diffraction optical element, and an optical device, an optical component, and an image display device using the diffraction optical element.

Solutions to Problems

The present inventors made intensive studies in order to solve the above-described problem, and as a result, have succeeded in further improving diffraction characteristics and transparency of a hologram, and have completed the present technology.

That is, the present technology provides a hologram recording composition containing at least a heteropoly acid, a photopolymerizable monomer, a photopolymerization initiator, and a sensitizing dye having absorption in a visible light region in the presence of an acid.

The heteropoly acid may be at least one selected from the group consisting of tungstic acid, molybdic acid, and vanadic acid.

The heteropoly acid may have a refractive index of 1.8 or more.

The sensitizing dye may have a cycloalkanone structure and one or more aromatic hydrocarbon groups each optionally having a substituent.

The sensitizing dye may have a structure represented by the following general formula (1).

[Chemical Formula 1]

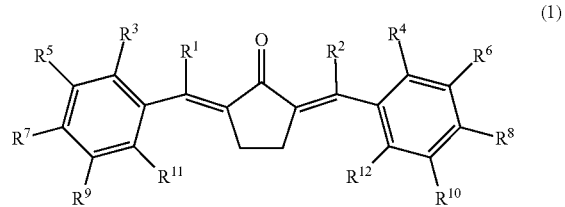

(1)

(In the general formula, $R^1$ to $R^{12}$ each independently represent an alkyl group, an acyl group, an ester group, an aryl group, a carboxyl group, a thiol group, a hydroxyl group, a halogen atom, or a hydrogen atom.)

The photopolymerizable monomer may have an ether bond or an ester bond.

Furthermore, the present technology provides a hologram recording medium including a photocurable resin layer containing at least a heteropoly acid, a photopolymerizable monomer, a photopolymerization initiator, and a sensitizing dye having absorption in a visible light region in the presence of an acid.

The heteropoly acid may be at least one selected from the group consisting of tungstic acid, molybdic acid, and vanadic acid.

The heteropoly acid may have a refractive index of 1.8 or more.

The sensitizing dye may have a cycloalkanone structure and one or more aromatic hydrocarbon groups each optionally having a substituent.

The sensitizing dye may have a structure represented by the following general formula (1).

[Chemical Formula 2]

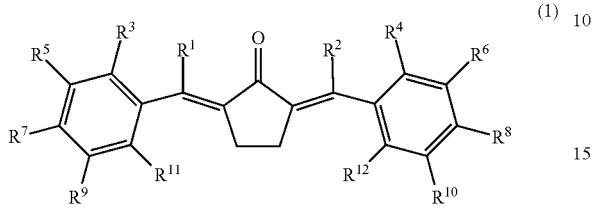

(1)

(In the general formula, $R^1$ to $R^{12}$ each independently represent an alkyl group, an acyl group, an ester group, an aryl group, a carboxyl group, a thiol group, a hydroxyl group, a halogen atom, or a hydrogen atom.)

The photopolymerizable monomer may have an ether bond or an ester bond.

The hologram recording medium may include at least one transparent base material, and the photocurable resin layer may be formed on the at least one transparent base material.

The hologram recording medium may be a volume phase type hologram recording medium.

Furthermore, the present technology also provides a diffraction optical element using the hologram recording medium.

The diffraction optical element may have a refractive index modulation degree of 0.05 or more.

The diffraction optical element may have a visible light transmittance of 80% or more and a haze of 0.5% or less.

The present technology also provides an optical device using the diffraction optical element.

Furthermore, the present technology also provides an optical component using the diffraction optical element.

Moreover, the present technology also provides an image display device using the diffraction optical element.

BRIEF DESCRIPTION OF DRAWINGS

FIG. 1 is a cross-sectional view schematically illustrating an example of a hologram recording medium according to an embodiment of the present technology.

MODE FOR CARRYING OUT THE INVENTION

Hereinafter, a preferred embodiment for carrying out the present technology will be described. Note that the embodiments described below exemplify representative embodiments of the present technology, and the scope of the present technology is not limited to the embodiments.

Note that the present technology will be described in the following order.

1. Summary of the present technology
2. First embodiment (hologram recording composition)
2-1. Hologram recording composition
2-2. Heteropoly acid
2-3. Photopolymerizable monomer
2-4. Photopolymerization initiator
2-5. Sensitizing dye
2-6. Other components
2-7. Method for manufacturing hologram recording composition
3. Second embodiment (hologram recording medium)
3-1. Hologram recording medium
3-2. Photocurable resin layer
3-3. Transparent base material
3-4. Method for manufacturing hologram recording medium
4. Third embodiment (diffraction optical element)
4-1. Diffraction optical element
4-2. Method for manufacturing diffraction optical element
5. Fourth embodiment (optical device, optical component, and image display device)

1. Summary of the Present Technology

First, summary of the present technology will be described.

The present technology relates to a hologram recording composition, a hologram recording medium, a diffraction optical element, and an optical device, an optical component, and an image display device using the diffraction optical element.

Examples of a hologram is a volume phase type hologram in which patterns having optical anisotropy are arranged at a predetermined period. As a material for obtaining a high refractive index modulation amount (Δn) in a volume phase type hologram, for example, an organic molecule in which a plurality of aromatic rings is linked to each other, an organometallic complex in which a metal atom is complexed with the organic molecule, and oxide fine particles of a Group 4 element (Ti, Zr, and the like) have been proposed so far. However, the organic molecule itself or the organometallic complex itself may absorb visible light, and it may be difficult to use the organic molecule or the organometallic complex as it is as a material for a visible light transparent optical element. Furthermore, the oxide fine particles have low compatibility with an organic binder, and it may be difficult to use the oxide fine particles as they are as a material for a visible light transparent optical element because of occurrence of haze.

In order to further improve diffraction characteristics and transparency of a hologram, the present inventors have considered use of a heteropoly acid as a material having a high refractive index, not having absorption in visible light, and having high compatibility with an organic binder. However, many of sensitizing dyes generally used in a hologram recording medium are decolorized by a strong acid. Therefore, when a heteropoly acid, which is a strong acid, is combined with such a sensitizing dye, the function of the sensitizing dye is not exhibited, and hologram recording cannot be performed.

Therefore, the present inventors have found that hologram recording can be performed even in the presence of a heteropoly acid by combining a heteropoly acid with a sensitizing dye having absorption in a visible light region in the presence of an acid. Moreover, the present inventors have found that a hologram recording composition containing these materials can further improve diffraction characteristics and transparency of a hologram.

That is, by combining, as a material for a hologram, a heteropoly acid with a sensitizing dye having absorption in a visible light region in the presence of an acid, the present technology can provide a hologram recording composition having excellent diffraction characteristics and transparency, a hologram recording medium, and a diffraction optical element, and an optical device, an optical component, and an image display device using the diffraction optical element.

2. First Embodiment (Hologram Recording Composition)

[2-1. Hologram Recording Composition]

A hologram recording composition according to a first embodiment of the present technology is a hologram recording composition containing at least a heteropoly acid, a photopolymerizable monomer, a photopolymerization initiator, and a sensitizing dye having absorption in a visible light region in the presence of an acid.

The hologram recording composition according to the first embodiment of the present technology can provide a hologram having excellent diffraction characteristics and transparency. Hereinafter, each of the components will be described in detail.

[2-2. Heteropoly Acid]

The heteropoly acid contained in the hologram recording composition according to the present embodiment has a high refractive index, does not have absorption in visible light, and has high compatibility with an organic binder. Therefore, an obtained diffraction optical element can have a favorable refractive index modulation amount ($\Delta n$) and visible light transmittance, and can have a reduced haze.

In the present embodiment, the heteropoly acid is preferably at least one selected from the group consisting of tungstic acid, molybdic acid, and vanadic acid. Furthermore, the heteropoly acid is preferably a compound having a Keggin structure.

Specific examples thereof include the following compounds, and one or more of these compounds can be used.

Borotungstic acid represented by $H_5[BW_{12}O_{40}]$; silicotungstic acid represented by $H_4[SiW_{12}O_{40}]$; cobalt tungstic acid represented by $H_6[CoW_{12}O_{40}]$; aluminotungstic acid represented by $H_5[AlW_{12}O_{40}]$; 5-(gallium tungstic acid) represented by $H_5[GaW_{12}O_{40}]$; phosphotungstic acid represented by $H_3[PW_{12}O_{40}]$; phosphomolybdic acid represented by $H_3[PMo_{12}O_{40}]$; germanotungstic acid represented by $H_4[GeW_{12}O_{40}]$; molybdovanadophosphoric acid represented by $H_{3+x}[PMo_{12-x}V_xO_{40}]$ ($0 \leq x \leq 12$); molybdovanadosilicic acid represented by $H_{4+y}[SiMo_{12-y}V_yO_{40}]$ ($0 \leq y \leq 6$); vanadotungstophosphoric acid represented by $H_{3+z}[PV_zW_{12-z}O_{40}]$ ($0 \leq z \leq 4$); hydrates thereof; and the like.

Furthermore, the heteropoly acid preferably has a refractive index of 1.8 or more. Note that in the present technology, the refractive index can be measured by a critical angle method or a spectroscopic ellipsometry method. For example, in the critical angle method, the refractive index can be measured using an Abbe refractometer ER-1 manufactured by Shibuya Optical Co., Ltd. (measurement wavelength 589 nm).

The content of the heteropoly acid in the hologram recording composition may be appropriately set by those skilled in the art, but is preferably 5 to 95% by mass with respect to the total mass of the hologram recording composition.

[2-3. Photopolymerizable Monomer]

The photopolymerizable monomer contained in the hologram recording composition according to the present embodiment is not particularly limited, and any photopolymerizable monomer can be used.

In the present embodiment, the photopolymerizable monomer preferably has an ether bond or an ester bond. Alternatively, in the present embodiment, the photopolymerizable monomer is preferably a carbazole-based monomer.

By using these monomers, a haze when these monomers are combined with the heteropoly acid can be further reduced.

As the photopolymerizable monomer having an ether bond or an ester bond, specifically, a monofunctional, bifunctional, trifunctional, or polyfunctional acrylate monomer; a methacrylate monomer; a urethane acrylate; and the like are preferable, and one or more of these monomers can be used. More specific examples thereof include a diacrylate monomer such as tricyclodecanedimethanol diacrylate.

Meanwhile, as the carbazole-based monomer, specifically, a monofunctional, bifunctional, trifunctional, or polyfunctional carbazole-based monomer is preferable, and one or more of these monomers can be used. More specifically, vinylcarbazole or a derivative thereof and the like can be used, and more specific examples thereof include N-vinylcarbazole.

[2-4. Photopolymerization Initiator]

The photopolymerization initiator contained in the hologram recording composition according to the present embodiment is not particularly limited, and any photopolymerization initiator can be used.

Examples of the photopolymerization initiator in the present embodiment include a radical polymerization initiator (radical generator), a cationic polymerization initiator (acid generator), and those having the functions of both of these initiators. One or more of these initiators can be used. Note that an anionic polymerization initiator (base generator) may be used as the photopolymerization initiator.

Examples of the radical polymerization initiator (radical generator) include an imidazole derivative, a bisimidazole derivative, an N-arylglycine derivative, an organic azide compound, a titanocene, an aluminate complex, an organic peroxide, an N-alkoxypyridinium salt, and a thioxanthone derivative. One or more of these compounds can be used.

Specific examples thereof include 1,3-di(t-butyldioxycarbonyl) benzophenone, 3,3',4,4'-tetrakis(t-butyldioxycarbonyl) benzophenone, 3-phenyl-5-isoxazolone, 2-mercaptobenzimidazole, bis(2,4,5-triphenyl) imidazole, 2,2-dimethoxy-1,2-diphenylethan-1-one (trade name: Irgacure 651 manufactured by Ciba Specialty Chemicals Co., Ltd.), 1-hydroxy-cyclohexyl-phenyl-ketone (trade name: Irgacure 184 manufactured by Ciba Specialty Chemicals Co., Ltd.), 2-benzyl-2-dimethylamino-1-(4-morpholinophenyl)-butanone-1 (trade name: Irgacure 369 manufactured by Ciba Specialty Chemicals Co., Ltd.), and bis ($\eta$5-2,4-cyclopentadien-1-yl)-bis(2,6-difluoro-3-(1H-pyrrol-1-yl)-phenyl) titanium (trade name: Irgacure 784 manufactured by Ciba Specialty Chemicals Co., Ltd.), but are not limited thereto. One or more of these compounds can be used.

Examples of the cationic polymerization initiator (acid generator) include a sulfonate, imide sulfonate, a dialkyl-4-hydroxysulfonium salt, an aryl sulfonic acid-p-nitrobenzyl ester, a silanol-aluminum complex, and ($\eta$6-benzene) ($\eta$5-cyclopentadienyl) iron (II). One or more of these compounds can be used.

Specific examples thereof include benzointosylate, 2,5-dinitrobenzyltosylate, and N-tosyphthalateimide, but are not limited thereto.

Examples of those used as both the radical polymerization initiator (radical generator) and the cationic polymerization initiator (acid generator) include a diaryliodonium salt, a diaryliodonium organic boron complex, an aromatic sulfonium salt, an aromatic diazonium salt, an aromatic phosphonium salt, a triazine compound, and an iron-arene complex-based compound. One or more of these compounds can be used.

Specific examples thereof include: an iodonium salt such as a chloride, a bromide, a borofluoride salt, a hexafluorophosphate salt, or a hexafluoroantimonate salt of an iodonium such as 4-isopropyl-4'-methyldiphenyliodonium tetrakis(pentafluorophenyl) borate, diphenyliodonium, ditolyliodonium, bis(p-tert-butylphenyl) iodonium, or bis(p-chlorophenyl) iodonium; a sulfonium salt such as a chloride, a bromide, a borofluoride salt, a hexafluorophosphate salt, or a hexafluoroantimonate salt of a sulfonium such as triphenylsulfonium, 4-tert-butyltriphenylsulfonium, or tris(4-methylphenyl) sulfonium; and a 2,4,6-substituted-1,3,5-triazine compound such as 2,4,6-tris(trichloromethyl)-1,3,5-triazine, 2-phenyl-4,6-bis(trichloromethyl)-1,3,5-triazine, or 2-methyl-4,6-bis(trichloromethyl)-1,3,5-triazine, but are not limited thereto. One or more of these compounds can be used.

[2-5. Sensitizing Dye]

The sensitizing dye contained in the hologram recording composition according to the present embodiment has absorption in a visible light region in the presence of an acid. The sensitizing dye can sensitize the sensitivity of a photopolymerization initiator to light. Since the sensitizing dye has absorption in a visible light region in the presence of an acid, the above-described action of the sensitizing dye can be exhibited even in the presence of the heteropoly acid contained in the hologram recording composition according to the first embodiment of the present technology.

In the present embodiment, the sensitizing dye preferably has a cycloalkanone structure and one or more aromatic hydrocarbon groups each optionally having a substituent. Moreover, the sensitizing dye more preferably has a structure represented by the following general formula (1).

[Chemical Formula 3]

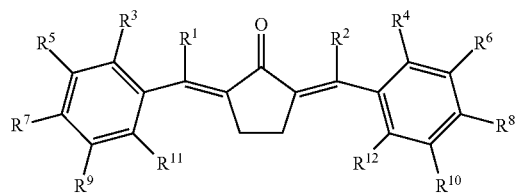

(1)

In the general formula, $R^1$ to $R^{12}$ each independently represent an alkyl group, an acyl group, an ester group, an aryl group, a carboxyl group, a thiol group, a hydroxyl group, a halogen atom, or a hydrogen atom.

Specific examples thereof include the following compounds, and one or more of these compounds can be used.

Examples of the compound having an alkyl group on the phenyl group in the above general formula include 2,5-bis (phenylmethylene) cyclopentanone, 2,5-bis[(4-methylphenyl) methylene] cyclopentanone, 2,5-bis[(4-isopropylphenyl) methylene] cyclopentanone, and 2,5-bis[(3,4,5-trimethylphenyl) methylene] cyclopentanone;

examples of the compound having an acyl group on the phenyl group in the above general formula include 2,5-bis [(4-acetylphenyl) methylene] cyclopentanone;

examples of the compound having a carboxyl group on the phenyl group in the above general formula include 4,4'-bis[(2-oxo-1,3-cyclopentanediylidene) dimethidrine] benzoic acid;

examples of the compound having a thiol group on the phenyl group in the above general formula include 2,5-bis [(4-mercaptophenyl) methylene] cyclopentanone;

examples of the compound having a hydroxyl group on the phenyl group in the above general formula include 2,5-bis[(4-hydroxyphenyl) methylene] cyclopentanone;

examples of the compound having a halogen atom or a halomethyl group on the phenyl group in the above general formula include 2,5-bis[(4-chlorophenyl) methylene] cyclopentanone and 2,5-bis[(4-trichloromethylphenyl) methylene] cyclopentanone;

examples of the compound having a substituent on the alkenyl group in the above general formula include 2,5-bis (1-phenylethylidene) cyclopentanone; and examples of the compound having a hydrogen atom on the phenyl group in the above general formula include 2,5-dibenzidenecyclopentanone.

The content of the sensitizing dye in the hologram recording composition may be appropriately set by those skilled in the art, but is preferably 0.1 to 20% by mass with respect to the total mass of the hologram recording composition.

[2-6. Other Components]

The hologram recording composition according to the present embodiment may contain a binder resin, a plasticizer, a polymerization inhibitor, a chain transfer agent, a solvent, and the like in addition to the above components.

The binder resin can be effective for improving film strength and improving heat resistance and mechanical strength.

Examples of the binder resin include: a vinyl acetate-based resin such as polyvinyl acetate or a hydrolyzate thereof; an acrylic resin such as a poly (meth)acrylate or a partial hydrolyzate thereof; polyvinyl alcohol or a partially acetal product thereof; triacetylcellulose; polyisoprene; polybutadiene; polychloroprene; silicone rubber; polystyrene; polyvinyl butyral; polychloroprene; polyvinyl chloride; polyarylate; chlorinated polyethylene; chlorinated polypropylene; poly-N-vinylcarbazole or a derivative thereof; poly-N-vinylpyrrolidone or a derivative thereof; polyallylate; a copolymer of styrene and maleic anhydride or a semiester thereof; and a copolymer in which at least one selected from a copolymerizable monomer group including acrylic acid, an acrylate, methacrylic acid, a methacrylate, acrylamide, acrylic nitrile, ethylene, propylene, vinyl chloride, vinyl acetate, and the like is a polymerization component, and one or more of these compounds can be used. Moreover, as the copolymerization component, a monomer containing a curable functional group that is thermally curable or photocurable can also be used.

Furthermore, as the binder resin, an oligomer type curable resin can also be used. Examples thereof include epoxy compounds generated by a condensation reaction between various phenol compounds such as bisphenol A, bisphenol S, novolak, o-cresol novolak, and p-alkylphenol novolak, and epichlorohydrin, and one or more of these compounds can be used.

The plasticizer can be effective for adjusting adhesiveness, flexibility, hardness, and other physical characteristics of the hologram recording composition.

Examples of the plasticizer include triethylene glycol, triethylene glycol diacetate, triethylene glycol dipropionate, triethylene glycol dicaprylate, triethylene glycol dimethyl ether, poly (ethylene glycol), poly (ethylene glycol) methyl ether, triethylene glycol bis(2-ethylhexanoate), tetraethylene glycol diheptanoate, diethyl sepacate, dibutyl suberate, tris (2-ethylhexyl) phosphate, isozolovilnaphthalene, diisopropylnaphthalene, poly (propylene glycol), glyceryl tributyrate, diethyl adipate, diethyl sebacate, nobutyl superate, tributyl phosphate, and tris(2-ethylhexyl) phosphate, and one or more of these compounds can be used.

Examples of the polymerization inhibitor include a quinone-based compound such as hydroquinone; a hindered phenol-based compound; a benzotriazole compound; and a thiazine-based compound such as phenothiazine, and one or more of these compounds can be used.

The chain transfer agent abstracts a radical from a growth end in a polymerization reaction to stop growth, and is added to the photopolymerizable monomer as a new polymerization reaction initiator species to make it possible to start growth of a new polymer. Use of the chain transfer agent increases the frequency of chain transfer of radical polymerization to increase the reaction rate of the photopolymerizable monomer, and makes it possible to improve sensitivity to light. Furthermore, the increase in the reaction rate of the photopolymerizable monomer and the increase in a reaction contributing component make it possible to adjust the degree of polymerization of the photopolymerizable monomer.

Examples of the chain transfer agent include α-methylstyrene dimer, 2-mercaptobenzoxazole, 2-mercaptobenzothiazole, tert-butyl alcohol, n-butanol, isobutanol, isopropylbenzene, ethylbenzene, chloroform, methylethylketone, propylene, and vinyl chloride, and one or more of these compounds can be used.

The solvent can be effective for adjusting viscosity and compatibility, and also for improving a film-forming property and the like.

Examples of the solvent include acetone, xylene, toluene, methyl ethyl ketone, tetrahydrofuran, benzene, methylene chloride, dichloromethane, chloroform, and methanol, and one or more of these compounds can be used.

[2-7. Method for Manufacturing Hologram Recording Composition]

The hologram recording composition according to the first embodiment of the present technology can be manufactured, for example, by adding a heteropoly acid, a photopolymerizable monomer, a photopolymerization initiator, and a sensitizing dye in predetermined amounts to the above-described solvent at room temperature and the like, dissolving these components in the solvent, and mixing these components with each other. Furthermore, the above-described binder resin, plasticizer, polymerization inhibitor, chain transfer agent, and the like may be added depending on an intended use, a purpose, and the like. When the hologram recording composition according to the first embodiment of the present technology is used as a hologram recording medium described later, the hologram recording composition may be used as a coating liquid.

3. Second Embodiment (Hologram Recording Medium)

[3-1. Hologram Recording Medium]

A hologram recording medium according to a second embodiment of the present technology is a hologram recording medium including a photocurable resin layer containing at least a heteropoly acid, a photopolymerizable monomer, a photopolymerization initiator, and a sensitizing dye having absorption in a visible light region in the presence of an acid. The hologram recording medium according to the present embodiment includes the hologram recording composition according to the first embodiment of the present technology. The hologram recording medium according to the present embodiment may include at least one transparent base material, and a photocurable resin layer may be formed on the at least one transparent base material.

Here, FIG. 1 illustrates a schematic cross-sectional view of an example of the hologram recording medium according to the present embodiment. The hologram recording medium 1 illustrated in the drawing has a three-layer structure in which a photocurable resin layer 12 is disposed between a transparent protective film 11 (transparent base material) and a glass or film substrate (transparent base material) 13. As described above, the hologram recording medium according to the present embodiment may have a three-layer structure in which the photocurable resin layer is formed on a first transparent base material, and moreover, a second transparent base material is formed on a main surface of the photocurable resin layer on which the first transparent base material is not formed.

The hologram recording medium according to the present embodiment is preferably a volume phase type hologram recording medium or a relief hologram recording medium, and more preferably a volume phase type hologram recording medium.

The hologram recording medium according to the second embodiment of the present technology can provide a hologram having excellent diffraction characteristics and transparency.

[3-2. Photocurable Resin Layer]

The photocurable resin layer included in the hologram recording medium according to the second embodiment of the present technology contains at least a heteropoly acid, a photopolymerizable monomer, a photopolymerization initiator, and a sensitizing dye having absorption in a visible light region in the presence of an acid. The photocurable resin layer contains the materials of the hologram recording composition according to the first embodiment of the present technology, and all the contents described for each of the materials in the above Section 2. also apply to the photocurable resin layer of the hologram recording medium in the present embodiment. The photocurable resin layer of the hologram recording medium may contain the hologram recording composition according to the first embodiment of the present technology and other materials, or may contain the hologram recording composition according to the first embodiment of the present technology.

The thickness of the photocurable resin layer of the hologram recording medium according to the present embodiment may be appropriately set by those skilled in the art, but is preferably 0.1 to 100 μm from a viewpoint of diffraction efficiency and sensitivity to light.

[3-3. Transparent Base Material]

The hologram recording medium according to the second embodiment of the present technology may include at least one transparent base material. As the transparent base material, a glass substrate, a substrate containing a resin having transparency, and the like may be used.

Specific examples of the substrate containing a resin having transparency include: a polyester film such as a polyethylene film, a polypropylene film, a polyethylene fluoride-based film, a polyvinylidene fluoride film, a polyvinyl chloride film, a polyvinylidene chloride film, an ethylene-vinyl alcohol film, a polyvinyl alcohol film, a polymethyl methacrylate film, a polyether sulfone film, a polyether ether ketone film, a polyamide film, a tetrafluoroethyleneperfluoroalkyl vinyl copolymer film, or a polyethylene terephthalate film; and a polyimide film. One or more of these compounds can be used.

The thickness of the transparent base material of the hologram recording medium according to the present embodiment may be appropriately set by those skilled in the art, but is preferably 0.1 to 100 μm from a viewpoint of transparency and rigidity of the hologram recording medium. The film exemplified above can be used as a protective film of the hologram recording medium, and the film can be laminated on a coating surface. In this case, a contact surface between the laminate film and the coating surface may be subjected to a mold release treatment such that the laminate film can be easily peeled off later.

[3-4. Method for Manufacturing Hologram Recording Medium]

The hologram recording medium according to the second embodiment of the present technology can be obtained, for example, by applying a coating liquid containing the hologram recording composition described in the above Section 2. onto a transparent base material using a spin coater, a gravure coater, a comma coater, a bar coater, and the like, and then drying the coating liquid to form a photocurable resin layer.

4. Third Embodiment (Diffraction Optical Element)

[4-1. Diffraction Optical Element]

A diffraction optical element according to a third embodiment of the present technology can be obtained by using the hologram recording medium according to the second embodiment of the present technology. The diffraction optical element according to the present embodiment can be obtained, for example, by exposing the above-described hologram recording medium to light by a method described later. The diffraction optical element includes, for example, at least a heteropoly acid, a polymer and/or an oligomer containing a structural unit derived from a photopolymerizable monomer, a photopolymerization initiator that has generated an active species by irradiation with external energy to change its structure, and a decolorized sensitizing dye.

The diffraction optical element according to the present embodiment preferably has a refractive index modulation amount ($\Delta n$) of 0.05 or more. Moreover, the diffraction optical element according to the present embodiment preferably has a visible light transmittance of 80% or more and a haze of 0.5% or less.

Note that in the present technology, the refractive index modulation amount ($\Delta n$) can be calculated from the transmittance and half value of a visible light transmittance spectrum center wavelength according to Kogelnik's coupling wave theory described in Bell System Technical Journal, 48, 2909 (1969). The visible light transmittance spectrum can be obtained by measuring transmittance at 400 to 700 nm using a spot light source manufactured by Hamamatsu Photonics K.K. as a light source and using a small fiber optical spectroscope USB-4000 manufactured by Ocean Optics, Inc. as a spectroscope.

In the present technology, the visible light transmittance can be measured by, for example, the method described in Japanese Industrial Standard JIS K 7105.

Furthermore, in the present technology, the haze can be measured by, for example, the method described in Japanese Industrial Standard JIS K 7136.

The diffraction optical element according to the third embodiment of the present technology provides a high refractive index modulation amount ($\Delta n$), and exhibits an excellent effect of diffraction characteristics. Furthermore, the diffraction optical element according to the present embodiment has a high visible light transmittance and a low haze, and therefore has excellent transparency.

[4-2. Method for Manufacturing Diffraction Optical Element]

The diffraction optical element according to the third embodiment of the present technology can be obtained by, for example, exposing the hologram recording medium according to the second embodiment of the present technology to two beams using a semiconductor laser in a visible light region, then irradiating the entire surface of the hologram recording medium with ultraviolet rays (UV) to cure an uncured photopolymerizable monomer, and fixing a refractive index distribution to the hologram recording medium. Conditions for the two-beam exposure may be appropriately set by those skilled in the art depending on an intended use, a purpose, and the like of the diffraction optical element. However, exposure is preferably performed for 1 to 1000 seconds by setting the light intensity of one beam on the hologram recording medium to 0.1 to 100 mW/cm$^2$, and interference exposure is desirably performed such that an angle formed by the two beams is 0.1 to 179.9 degrees.

5. Fourth Embodiment (Optical Device, Optical Component, and Image Display Device)

An optical device, an optical component, and an image display device according to a fourth embodiment of the present technology use the diffraction optical element according to the third embodiment of the present technology.

Examples of the optical device, the optical component, and the image display device according to the present embodiment include an information recording medium such as an optical disk or a magneto-optical disk, an optical pickup device, an imaging device, a polarizing microscope, a sensor, a color filter, a diffractive lens, a light guide plate, a hologram screen, a transparent display, a head-mounted display, and a head-up display.

The optical device, the optical component, and the image display device according to the fourth embodiment of the present technology use the diffraction optical element having excellent diffraction characteristics and transparency. Therefore, it is possible to achieve an optical device, an optical component, and an image display device having high light utilization efficiency, high brightness, wide angle of view, and low power consumption. In particular, when the present technology is used for a display, it is possible to obtain a display having high see-through property and transparency.

Note that the embodiments of the present technology are not limited to the above-described embodiments, and various modifications can be made thereto without departing from the gist of the present technology.

Furthermore, the effects described here are merely examples, and the effects of the present technology are not limited thereto, and may include other effects.

Note that the present technology may have the following configurations.

[1]

A hologram recording composition containing at least a heteropoly acid, a photopolymerizable monomer, a photopolymerization initiator, and a sensitizing dye having absorption in a visible light region in the presence of an acid.

[2]

The hologram recording composition according to [1], in which the heteropoly acid is at least one selected from the group consisting of tungstic acid, molybdic acid, and vanadic acid.

[3]

The hologram recording composition according to [1] or [2], in which the heteropoly acid has a refractive index of 1.8 or more.

[4]

The hologram recording composition according to any one of [1] to [3], in which the sensitizing dye has a cycloalkanone structure and one or more aromatic hydrocarbon groups each optionally having a substituent.

[5]

The hologram recording composition according to [4], in which the sensitizing dye has a structure represented by the following general formula (1).

[Chemical Formula 4]

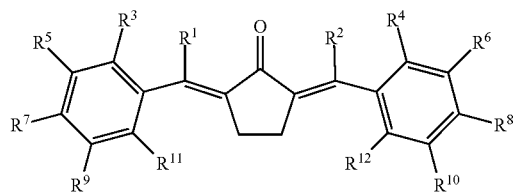

(1)

(In the general formula, $R^1$ to $R^{12}$ each independently represent an alkyl group, an acyl group, an ester group, an aryl group, a carboxyl group, a thiol group, a hydroxyl group, a halogen atom, or a hydrogen atom.)

[6]

The hologram recording composition according to any one of [1] to [5], in which the photopolymerizable monomer has an ether bond or an ester bond.

[7]

A hologram recording medium including a photocurable resin layer containing at least a heteropoly acid, a photopolymerizable monomer, a photopolymerization initiator, and a sensitizing dye having absorption in a visible light region in the presence of an acid.

[8]

The hologram recording medium according to [7], in which the heteropoly acid is at least one selected from the group consisting of tungstic acid, molybdic acid, and vanadic acid.

[9]

The hologram recording medium according to [7] or [8], in which the heteropoly acid has a refractive index of 1.8 or more.

[10]

The hologram recording medium according to any one of [7] to [9], in which the sensitizing dye has a cycloalkanone structure and one or more aromatic hydrocarbon groups each optionally having a substituent.

[11]

The hologram recording medium according to [10], in which the sensitizing dye has a structure represented by the following general formula (1).

[Chemical Formula 5]

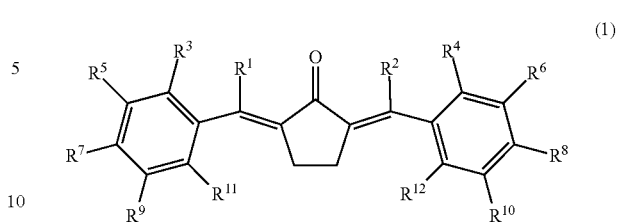

(1)

(In the general formula, $R^1$ to $R^{12}$ each independently represent an alkyl group, an acyl group, an ester group, an aryl group, a carboxyl group, a thiol group, a hydroxyl group, a halogen atom, or a hydrogen atom.)

[12]

The hologram recording medium according to any one of [7] to [11], in which the photopolymerizable monomer has an ether bond or an ester bond.

[13]

The hologram recording medium according to any one of [7] to [12], in which the hologram recording medium includes at least one transparent base material, and the photocurable resin layer is formed on the at least one transparent base material.

[14]

The hologram recording medium according to any one of [7] to [13], which is a volume phase type hologram recording medium.

[15]

A diffraction optical element using the hologram recording medium according to any one of [7] to [14].

[16]

The diffraction optical element according to [15], having a refractive index modulation degree of 0.05 or more.

[17]

The diffraction optical element according to [16], having a visible light transmittance of 80% or more and a haze of 0.5% or less.

[18]

An optical device using the diffraction optical element according to any one of [15] to [17].

[19]

An optical component using the diffraction optical element according to any one of [15] to [17].

[20]

An image display device using the diffraction optical element according to any one of [15] to [17].

EXAMPLES

Hereinafter, effects of the present technology will be specifically described with reference to Examples. Note that the scope of the present technology is not limited to the Examples.

Example 1

(Preparation of Hologram Recording Composition 1)

1.0 g of phosphotungstic acid dodecahydrate (manufactured by Nakalai Tesque, Inc.) as a heteropoly acid, 1.0 g of tricyclodecanedimethanol diacrylate ("A-DCP" manufactured by Shin-Nakamura Chemical Co., Ltd.) as a photopolymerizable monomer, 0.1 g of diethyl sebacate (manufactured by Kanto Chemical Co., Inc.) as a plasticizer, 0.1 g of 4-isopropyl-4'-methyldiphenyliodonium tetrakis(pentafluorophenyl) borate (manufactured by Tokyo Chemical Industry Co. Ltd.) as a photopolymerization initiator, 0.02 g of 2,5-dibenzylidene cyclopentanone (manufactured by Sigma-Aldrich) as a sensitizing dye, 0.06 g of 2-mercaptobenzoxazole (manufactured by Tokyo Chemical Industry Co. Ltd.) as a chain transfer agent, and 1.0 g of acetone as a solvent were mixed for 12 hours to prepare hologram recording composition 1.

(Preparation of Hologram Recording Medium 1)

The above hologram recording composition 1 was applied onto a 5 μm polyvinyl alcohol film with a bar coater such that a dry film thickness was 20 μm, and dried at room temperature for five minutes to obtain a photocurable resin layer. A resin surface was pressure-bonded onto a 0.7 mm glass substrate to obtain hologram recording medium 1 in which the glass substrate, the photocurable resin layer, and the polyvinyl alcohol film were laminated in this order.

(Preparation of Diffraction Optical Element 1)

The above hologram recording medium 1 was exposed to two beams using a semiconductor laser having an exposure wavelength of 457 nm. Thereafter, the entire surface of the hologram recording medium 1 was irradiated with ultraviolet rays (UV) to cure an uncured monomer, and a refractive index distribution was fixed to the medium 1. As for conditions for the two-beam exposure, exposure was performed for 30 seconds by setting the light intensity of one beam on the recording medium to 2.5 mW/cm$^2$, and interference exposure was performed such that an angle formed by the two beams was 3 degrees. As a result, a refractive index distribution was formed on the hologram recording medium 1 to obtain diffraction optical element 1.

(Evaluation of Diffraction Optical Element 1)

The refractive index modulation amount (Δn), visible light transmittance, and haze value of the prepared diffraction optical element 1 were measured.

Comparative Examples 1 to 4

(Preparation of Hologram Recording Compositions 101 to 104)

In Comparative Example 1, hologram recording composition 101 was obtained using similar materials to Example 1 and according to the amounts illustrated in Table 1 in a similar manner to Example 1 except that Aicaaitron Z-510IJ (manufactured by Aica Kogyo Co., Ltd.) was used as zirconia fine particles instead of the heteropoly acid.

In Comparative Example 2, hologram recording composition 102 was obtained using similar materials to Example 1 and according to the amounts illustrated in Table 1 in a similar manner to Example 1 except that OGSOL EA-0200 (manufactured by Osaka Gas Chemicals Co., Ltd.) was used as an aromatic acrylate instead of the heteropoly acid, and Denka Saknohol SN-09T (manufactured by Denka Company Limited) was used as a photopolymerizable monomer instead of tricyclodecanedimethanol diacrylate.

In Comparative Example 3, hologram recording composition 103 was obtained using similar materials to Example 1 and according to the amounts illustrated in Table 1 in a similar manner to Example 1 except that pentabromophenyl methacrylate (manufactured by Sigma-Aldrich) was used instead of the heteropoly acid, and Denka Saknohol SN-09T (manufactured by Denka Company Limited) was used as a photopolymerizable monomer instead of tricyclodecanedimethanol diacrylate.

In Comparative Example 4, hologram recording composition 104 was obtained using similar materials to Example 1 and according to the amounts illustrated in Table 1 in a similar manner to Example 1 except that 2,5-bis(diethylaminobenzylidene) cyclopentanone (manufactured by ACROS ORGANIC), which is a sensitizing dye that has a substituent (amino group) to react with an acid and decolorizes in the presence of an acid, was used instead of 2,5-dibenzylidene cyclopentanone as the sensitizing dye.

(Preparation of Hologram Recording Media 101 to 104)

Hologram recording media 101 to 104 were prepared in a similar manner to Example 1 using the above hologram recording compositions 101 to 104, respectively.

(Preparation of Diffraction Optical Elements 101 to 104)

Diffraction optical elements 101 to 104 were prepared in a similar manner to Example 1 using the above hologram recording media 101 to 104, respectively.

(Evaluation of Diffraction Optical Elements 101 to 104)

The refractive index modulation amount (Δn), visible light transmittance, and haze value of each of the prepared diffraction optical elements 101 to 104 were measured.

Experimental Results

Table 1 illustrates the experimental results of the diffraction optical elements in Example 1 and Comparative Examples 1 to 4 described above. Note that In Table 1, the numerical value of each component is indicated by a weight ratio.

TABLE 1

| | | Example 1 | Comparative Example 1 | Comparative Example 2 | Comparative Example 3 | Comparative Example 4 |
|---|---|---|---|---|---|---|
| Composition | High refractive index component | | | | | |
| | Phosphotungstic acid dodecahydrate | 100 | — | — | — | 100 |
| | Aicaaitron Z-510IJ | — | 100 | — | — | — |
| | OGSOL EA-0200 | — | — | 100 | — | — |
| | Pentabromophenyl methacrylate | — | — | — | 100 | — |
| | Photopolymerizable monomer | | | | | |
| | Tricyclodecanedimethanol diacrylate | 100 | 100 | — | — | 100 |
| | Denka Saknohol SN-09T | — | — | 100 | 100 | — |
| | Plasticizer | | | | | |
| | Diethyl sebacate | 10 | 10 | 10 | 10 | 10 |
| | Photopolymerization initiator | | | | | |

TABLE 1-continued

|  |  | Example 1 | Comparative Example 1 | Comparative Example 2 | Comparative Example 3 | Comparative Example 4 |
|---|---|---|---|---|---|---|
|  | 4-isopropyl-4'-methyldiphenyliodonium tetrakis(pentafluorophenyl) borate | 10 | 10 | 10 | 10 | 10 |
|  | Sensitizing dye |  |  |  |  |  |
|  | 2,5-dibenzylidene cyclopentanone | 2.0 | 2.0 | 2.0 | 2.0 | — |
|  | 2,5-bis(diethylaminobenzylidene) cyclopentanone | — | — | — | — | 2.0 |
|  | Chain transfer agent |  |  |  |  |  |
|  | 2-Mercaptobenzoxazole | 6.0 | 6.0 | 6.0 | 6.0 | 6.0 |
| Evaluation | Refractive index modulation amount (Δn) | 0.06 | 0.01 | 0.04 | 0.04 | 0.01 |
|  | Visible light transmittance [%] | ≥90% | 80% | ≥90% | 60% | ≥90% |
|  | Haze value [%] | 0.27 | 35.2 | 0.15 | 0.20 | 0.25 |

As illustrated in Example 1 of Table 1, by combining a heteropoly acid, a photopolymerizable monomer, a photopolymerization initiator, and a sensitizing dye having absorption in a visible light region in the presence of an acid, a diffraction optical element having a high refractive index modulation amount (Δn) could be obtained. Furthermore, it has been found that the diffraction optical element has also excellent transparency because of having a high visible light transmittance and a low haze value.

REFERENCE SIGNS LIST

1 Hologram recording medium
11 Transparent protective film (transparent base material)
12 Photocurable resin layer
13 Glass or film substrate (transparent base material)

The invention claimed is:

1. A hologram recording composition comprising at least a heteropoly acid, a photopolymerizable monomer, a photopolymerization initiator, and a sensitizing dye having absorption in a visible light region in a presence of an acid,
   wherein the heteropoly acid is phosphotungstic acid dodecahydrate, wherein the photopolymerizable monomer is tricyclodecanedimethanol diacrylate, wherein the photopolymerization initiator is 4-isopropyl-4'-methyldiphenyliodonium tetrakis(pentafluorophenyl) borate, wherein the sensitizing dye is 2,5-dibenzylidene cyclopentanone, and
   wherein the hologram recording composition in a diffraction optical element is capable of providing a refractive index modulation degree of 0.05 or more in the diffraction optical element.

2. The hologram recording composition according to claim 1, wherein the heteropoly acid has a refractive index of 1.8 or more.

3. A hologram recording medium comprising a photocurable resin layer containing at least a heteropoly acid, a photopolymerizable monomer, a photopolymerization initiator, and a sensitizing dye having absorption in a visible light region in a presence of an acid,
   wherein the heteropoly acid is phosphotungstic acid dodecahydrate, wherein the photopolymerizable monomer is tricyclodecanedimethanol diacrylate, wherein the photopolymerization initiator is 4-isopropyl-4'-methyldiphenyliodonium tetrakis(pentafluorophenyl) borate, wherein the sensitizing dye is 2,5-dibenzylidene cyclopentanone, and
   wherein the hologram recording medium in a diffraction optical element is capable of providing a refractive index modulation degree of 0.05 or more in the diffraction optical element.

4. The hologram recording medium according to claim 3, wherein the heteropoly acid has a refractive index of 1.8 or more.

5. The hologram recording medium according to claim 3, wherein
   the hologram recording medium includes at least one transparent base material, and
   the photocurable resin layer is formed on the at least one transparent base material.

6. The hologram recording medium according to claim 3, wherein the hologram recording medium includes a volume phase type hologram.

7. A diffraction optical element comprising the hologram recording medium according to claim 3, wherein the hologram recording medium has been exposed to a semiconductor laser in a visible light region and then irradiated with ultraviolet rays, and wherein the diffraction optical element has a refractive index modulation degree of 0.05 or more.

8. The diffraction optical element according to claim 7, having a visible light transmittance of 80% or more and a haze of 0.5% or less.

9. An optical device comprising the diffraction optical element according to claim 7.

10. An optical component comprising the diffraction optical element according to claim 7.

11. An image display device comprising the diffraction optical element according to claim 7.

* * * * *